US005283537A

United States Patent [19]

Nakamura

[11] Patent Number: 5,283,537

[45] Date of Patent: Feb. 1, 1994

[54] CURRENT MIRROR CIRCUIT

[75] Inventor: Hiroyuki Nakamura, Atsugi, Japan

[73] Assignee: Canon Kabushiki Kaisha, Tokyo, Japan

[21] Appl. No.: 918,008

[22] Filed: Jul. 24, 1992

[30] Foreign Application Priority Data

Jul. 31, 1991 [JP] Japan .................................. 3-192076

[51] Int. Cl.[5] .............................................. H03F 3/04

[52] U.S. Cl. ...................................... 330/288; 315/315

[58] Field of Search ................. 330/288; 323/315, 316

[56] References Cited

U.S. PATENT DOCUMENTS

| | | | |
|---|---|---|---|
| 3,936,725 | 2/1976 | Schneider | 323/315 |
| 4,166,971 | 9/1979 | Schneider | 330/288 X |
| 4,412,186 | 10/1983 | Nagano | 330/285 |
| 4,503,381 | 3/1985 | Bowers | 323/315 |
| 4,716,305 | 12/1987 | Sakuragi et al. | 307/296 |
| 4,758,820 | 7/1988 | Tateno | 340/347 |
| 4,801,892 | 1/1989 | Yamakoshi et al. | 330/288 |
| 4,807,009 | 2/1989 | Fushimi et al. | 357/35 |
| 5,126,689 | 6/1992 | Nakamura | 330/296 |

FOREIGN PATENT DOCUMENTS

| | | | |
|---|---|---|---|
| 067447 | 6/1982 | European Pat. Off. | G05F 3/20 |
| 3114877 | 2/1982 | Fed. Rep. of Germany | H034/3/343 |
| 171110 | 10/1983 | Japan | 330/288 |
| 181804 | 10/1984 | Japan | 330/288 |

*Primary Examiner*—James B. Mullins

*Attorney, Agent, or Firm*—Fitzpatrick, Cella, Harper & Scinto

[57] ABSTRACT

A current mirror circuit has first through fourth transistors. The first and second transistors are of a first conductivity type and have their emitters connected to a power source and their bases commonly connected. The third transistor is of the first conductivity type and has its collector connected to a reference potential, its emitter connected to the bases of the first and second transistors, and its base connected to a collector of the first transistor. The fourth transistor is of the first conductivity type and has its emitter connected to a collector of the second transistor. A control device controls a base of the fourth transistor by an output current which changes in accordance with a current flowing in the collector of the first transistor.

1 Claim, 3 Drawing Sheets

CURRENT MIRROR CIRCUIT

BACKGROUND OF THE INVENTION

1. Field of the Invention

The invention relates to a current mirror circuit among electronic circuits which are used in various electronic apparatuses.

2. Related Background Art

A conventional current mirror circuit is constructed as shown in FIGS. 1 and 2.

The current mirror circuit of FIG. 1 has a circuit construction such that a constant current source 4 is connected to the collector side of a PNP transistor 2 in which the portion between the base and collector is short-circuited and a connecting point of the collector and base terminals is connected to a base terminal of another PNP transistor 6. Reference numeral 1 denotes a power source line. A collector current $I_{out}$ of the transistor 6 is generally expressed as follows by using a collector current $I_{in}$ of the transistor 2

$$I_{out} = \frac{I_{in}}{1 + \frac{2}{h_{FE}}} \quad (1)$$

or is expressed as follows in consideration of the Early effect $$I_{out} = \left(1 + \frac{V_{CB}}{V_A}\right) I_{in},\ h_{FE} = \infty \quad (2)$$

where, $h_{FE}$: current amplification factor $V_{CB}$: voltage between collector and base $V_A$: early voltage As will be obviously understood from the equation (1), however, $I_{out}$ depends on the magnitude of $h_{FE}$. For instance, when $h_{FE}=30$, $I_{out}=0.9375I_{in}$ and an error of 6% or more occurs. From the equation (2), even when $h_{FE}=\infty$, for instance, if $V_A=15$ V and $V_{CB}=2$ V, $I_{out}=0.88I_{in}$, so that there is a problem in that an error of 10% or more really occurs.

FIG. 2 is a diagram showing a current mirror circuit to reduce the dependency on $h_{FE}$ in the above two problems. An emitter of a transistor 3 whose collector is connected to a reference potential $V_{Ref}$ is connected to a base of the PNP transistor 2. A collector of the transistor 2 is connected to a base of the transistor 3. The rest of the construction is similar to that of FIG. 1. In the case of the circuit of FIG. 2, the collector current $I_{out}$ of the transistor 6 is generally given by $$I_{out} = \frac{I_{in}}{1 + \frac{2}{h_{FE}(1 + h_{FE})}} \quad (3)$$

For instance, in a manner similar to the circuit of FIG. 1, when $h_{FE}=30$, $I_{out}=0.998I_{in}$ and a mirror coefficient has a value which is near 100%. However, the dependency on the voltage between collector and base due to the Early effect still remains and there is a problem in that a large error occurs in a manner similar to the circuit of FIG. 1.

SUMMARY OF THE INVENTION

It is an object of the invention to provide a current mirror circuit which can simultaneously reduce the error due to the base current and the error due to the Early effect as the above problems.

According to one aspect of the invention is provided a current mirror circuit comprising: first and second transistors of the first conductivity type whose emitters are connected to a power source and whose bases are commonly connected; a third transistor of the first conductivity type whose collector is connected to a reference potential, whose emitter is connected to the bases of the first and second transistors, and whose base is connected to a collector of the first transistor; a fourth transistor of the first conductivity type whose emitter is connected to a collector of the second transistor; and control means for controlling a base of the fourth transistor by an output current which changes in accordance with a current flowing in the collector of the first transistor.

DETAILED DESCRIPTION OF THE PREFERRED EMBODIMENTS

The preferred embodiments of the invention will be described in detail hereinbelow with reference to the drawings. The invention, however, is not limited to the following embodiments but can be also applied to any other modifications which can accomplish the objects of the invention.

Embodiment 1

Figure 3:
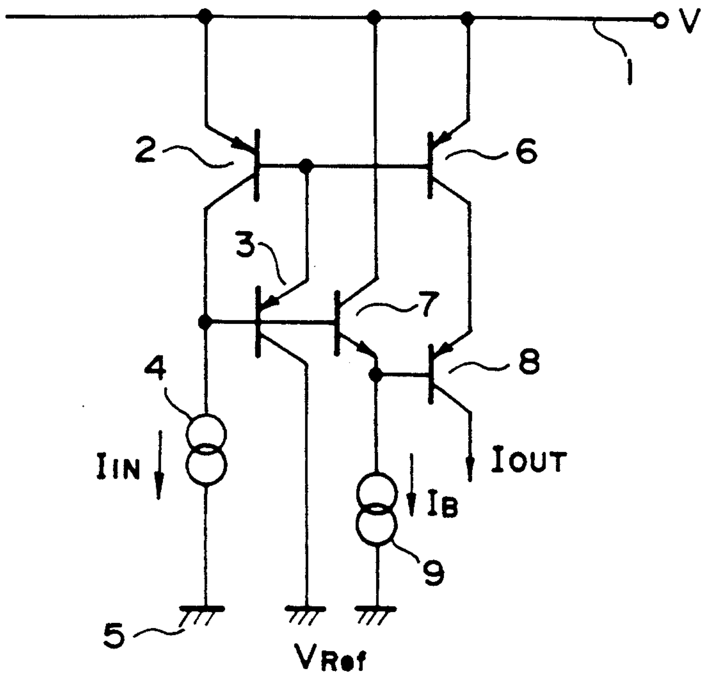
FIG. 3 is a circuit diagram of the first embodiment of the invention.

FIG. 3 shows a semiconductor integrated circuit according to the first embodiment of the invention. Reference numeral 1 denotes the power source line connected to a power source V. Reference numeral 2 denotes the bipolar transistor of the first conductivity type (PNP type) whose collector is connected to the constant current source 4 for causing the input current $I_{in}$ and whose emitter is connected to the power source line 1. The base of the bipolar transistor 2 is connected to a base of the transistor 6 which constructs a current mirror circuit together with the transistor 2. An emitter of the transistor 6 is connected to the power source line 1. Further, the bases of the transistors 2 and 6 are connected to the emitter of the transistor 3 of the first conductivity type whose collector is connected to the reference potential $V_{Ref}$ and which is used to compensate a base current.

The collector of the transistor 2 is connected to not only the constant current source 4 but also the base of the transistor 3 and a base of a transistor 7 of the second conductivity type (NPN type) whose collector is connected to the power source line 1. An emitter of the transistor 7 is connected to a base of a transistor 8 of the first conductivity type which gives the output current and the other terminal of a constant current source 9 whose one end is connected to the reference potential $V_{Ref}$.

An emitter of the transistor 8 is connected to a collector of the transistor 6. A collector current of the transistor 2 is $I_{C2}$, a base current is $I_{B2}$, an emitter current is $I_{E2}$, a voltage between base and emitter is $V_{BE2}$, and a voltage between collector and base is $V_{CB2}$. Similarly, for a transistor N, they are set to $I_{CN}$, $I_{BN}$, $I_{EN}$, $V_{BEN}$, and $V_{CBN}$, respectively. On the other hand, a current amplification factor of the transistor of the first conductivity type is $h_{FE1}$, a current amplification factor of the transistor of the second conductivity type is $h_{FE2}$, and an Early voltage of the transistor of the first conductivity type is $V_{A1}$. The following equations are satisfied for the circuit of FIG. 3.

$$I_{in} = I_{C2} + I_{B3} - I_{B7} \tag{4}$$

$$I_{B3} = \frac{I_{B2} + I_{B6}}{h_{FE1}} \simeq \frac{2I_{B2}}{h_{FE1}} = \frac{2I_{C2}}{h_{FE12}} \tag{5}$$

$$I_{B7} = \frac{I_B - (I_{B7} + I_{B8})}{h_{FE2}} = \frac{I_B - \frac{I_{out}}{h_{FE1}}}{1 + h_{FE2}} \tag{6}$$

The equation (4) shows that by setting $I_{B3}=I_{B7}$, the input currents $I_{in}$ and $I_{C2}$ can be equalized and the error due to the base current can be cancelled. The following equation (7) is obtained from the equations (5) and (6).

$$\frac{2I_{C2}}{h_{FE12}} = \frac{I_B - \frac{I_{out}}{h_{FE1}}}{1 + h_{FE2}} \tag{7}$$

The invention intends to equalize the input current $I_{in}$ and the output current $I_{out}$. From the equation (4), by setting $I_{B3}=I_{B7}$, $I_{in}=I_{C2}$. Therefore, from the equation (7), the following equation (8) is derived.

$$I_B = \frac{2 + 3h_{FE1}}{h_{FE12}} \cdot I_{in} \tag{8}$$

By setting the current $I_B$ flowing in the constant current source 9 for bias to the value of the equation (8), the error of the base current can be cancelled.

The reduction of the Early effect will now be described. The collector potentials $V_{C2}$ and $V_{C6}$ of the transistors 2 and 6 serving as a current mirror circuit can be respectively expressed as follows. Assuming that the potential of the power source line 1 is set to $V_{CC}$, $$V_{C2} = V_{CC} - V_{BE2} - V_{BE3} \tag{9}$$

$$V_{C6} = V_{CC} - V_{BE2} - V_{BE3} - V_{BE7} + V_{BE8} \tag{10}$$

The following equations are generally satisfied.

$$I_{S2} = \left(1 + \frac{V_{CB2}}{V_{A1}}\right) I_{S2} e \times p \frac{qV_{BE2}}{kT} \tag{11}$$

$$I_{S6} = \left(1 + \frac{V_{CB6}}{V_{A1}}\right) I_{S6} e \times p \frac{qV_{BE6}}{kT} \tag{12}$$

where, $I_{S2}$, $I_{S6}$: saturation currents in the opposite direction of the transistors 2 and 6 q, k, T: constants

Since the portion between the emitter and base of each of the transistors 2 and 6 is short-circuited, $V_{BE2}=V_{BE6}$ can be obtained in the equations (11) and (12). Generally, the opposite direction saturation currents of the transistors of the same size are almost equal in the integrated circuit and $I_{S2}=I_{S6}$ can be set. Therefore, in order to set $I_{S2}=I_{S6}$, it is sufficient that the following equation (13) is satisfied from the equations (11) and (12).

$$V_{CB2} = V_{CB6} \tag{13}$$

However, since the bases are commonly connected, the meaning of the equation (13) is substantially the same as the following equation (14).

$$V_{C2} = V_{C6} \tag{14}$$

By setting $$V_{BE7} = V_{BE8} \tag{15}$$

from the equations (9), (10), and (14), the collector potentials of the transistors 2 and 6 can be equalized and the Early effect can be reduced. From the equation (15), the following equation (16) is derived.

$$\frac{kT}{q} \ln \frac{I_{C7}}{I_{S7}} = \frac{kT}{q} \ln \frac{I_{out}}{I_{S8}} \tag{16}$$

In the equation (16), the transistor current $I_{C7}$ can be expressed by the following equation (18)

$$I_{C7} = \left(I_B - \frac{I_{out}}{h_{FE1}}\right) \Big/ \left(1 + \frac{1}{h_{FE2}}\right) \tag{18}$$

from the following equation (17).

$$\begin{aligned} I_{C7} &= I_{E7} - I_{B7} = (I_B - I_{B8}) - I_{B7} \\ &= I_B - \frac{I_{out}}{h_{FE1}} - \frac{I_{C7}}{h_{FE2}} \end{aligned} \tag{17}$$

From the equations (16) and (18), the following equation (19) is obtained.

$$\frac{\dfrac{I_B - \frac{I_{out}}{h_{FE1}}}{1 + \frac{1}{h_{FE2}}}}{I_{S7}} = \frac{I_{out}}{I_{S8}} \tag{19}$$

Figure 1:
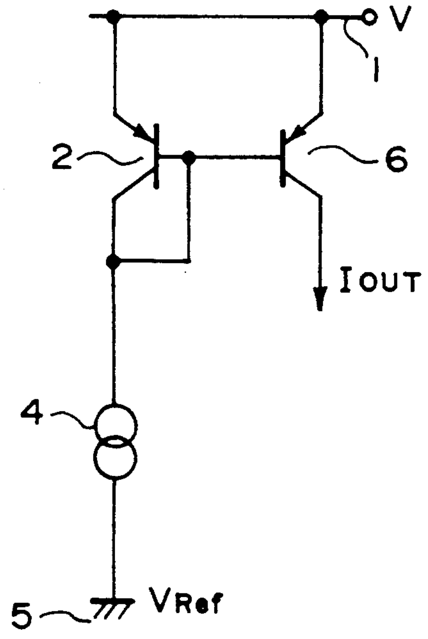
FIG. 1 PRIOR ART
FIG. 1 is a circuit diagram of a conventional current mirror circuit.
Figure 2:
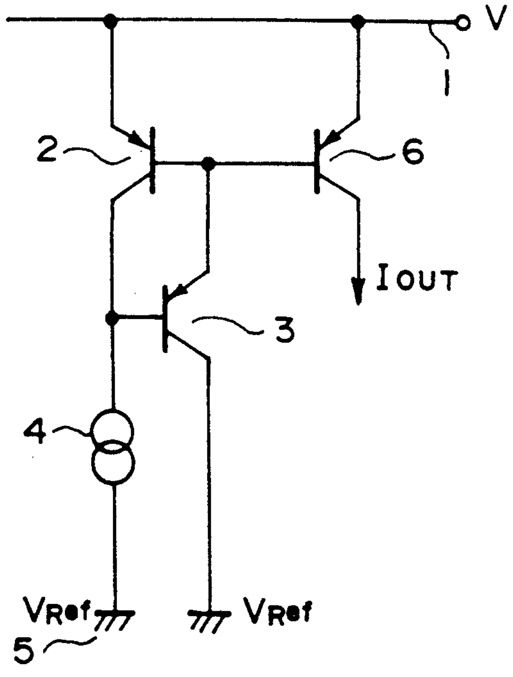
FIG. 2 PRIOR ART
FIG. 2 is a circuit diagram of another conventional current mirror circuit.
Figure 4:
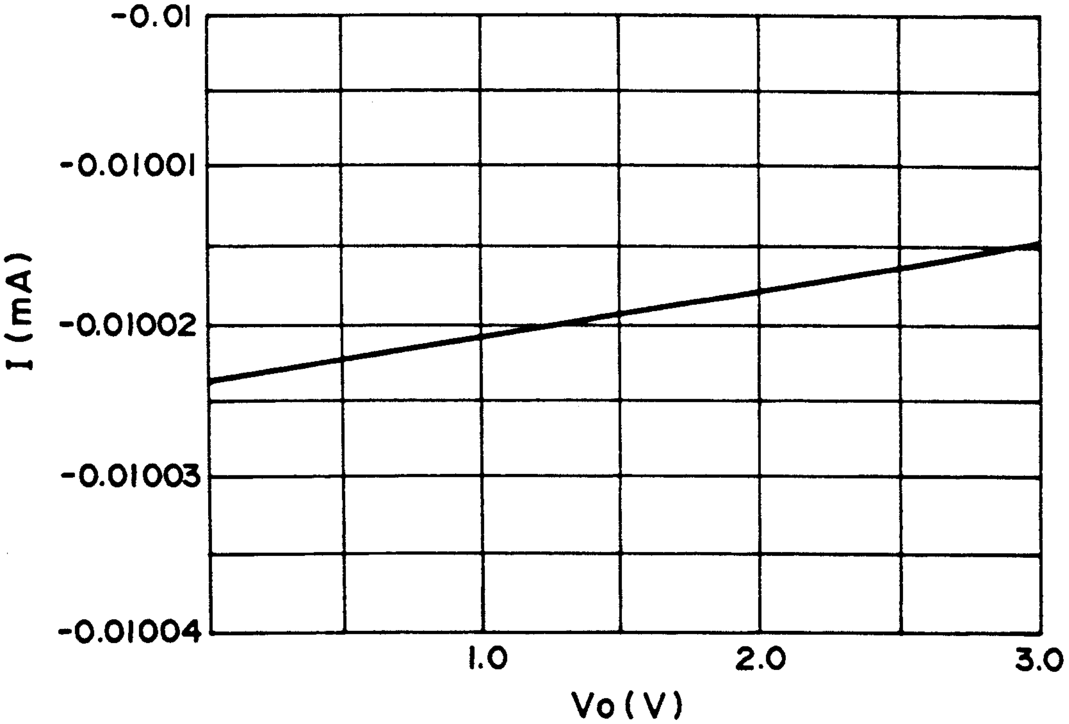
FIG. 4 is a diagram showing the result of simulation of the circuit of the invention.
Figure 5:
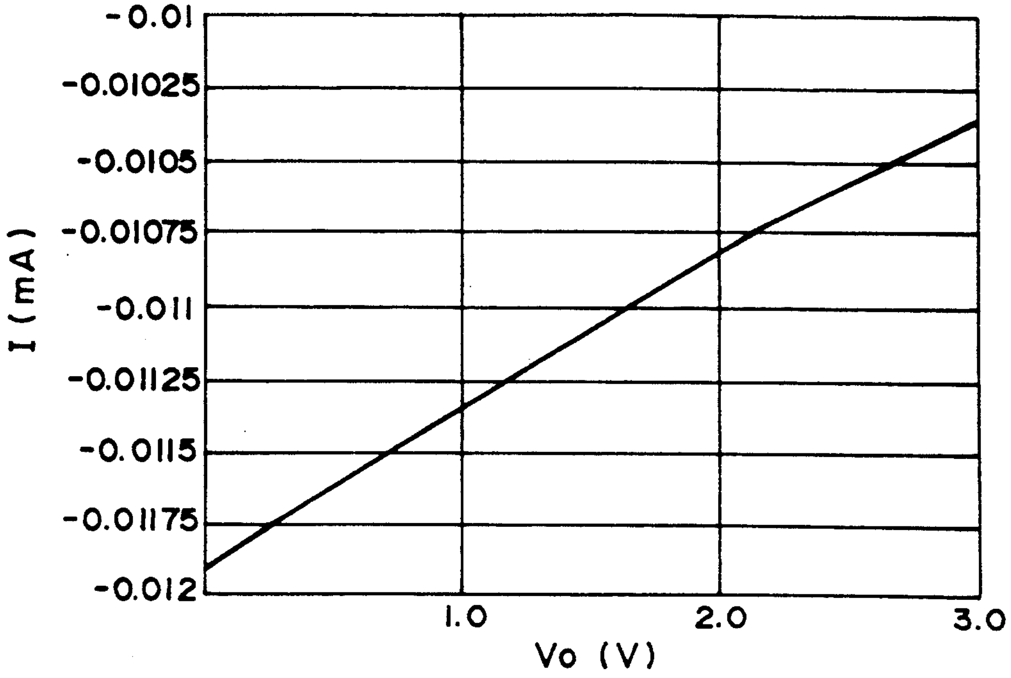
FIG. 5 PRIOR ART
FIG. 5 is a diagram showing the result of simulation of the conventional circuit.

From the equation (19), by setting $$I_B = \left\{ \frac{I_{S7}}{I_{S8}} \left(1 + \frac{1}{h_{FE2}}\right) + \frac{1}{h_{FE1}} \right\} I_{out} \tag{20}$$

the Early effect can be eliminated. FIG. 4 shows the result of simulation according to the current mirror circuit of the invention. The axis of the abscissa indicates the collector potential of the transistor 8, and the axis of the ordinate indicates the output current. When the input current $I_{in}=10$ μA, the output current lies within a range from 10.00235 μA to 10.0025 μA so long as the collector potential lies within a range from 0 to 3V. An error of up to 0.025% occurs. FIG. 5 shows the result of simulation of the conventional circuit of FIG. 2. Under the same condition as that mentioned above, the output current lies within a range from 11.89 μA to 10.38 μA and an error of up to 18.9% occurs. A current mirror circuit of a high precision can be obtained by the invention.

Embodiment 2

Figure 6:
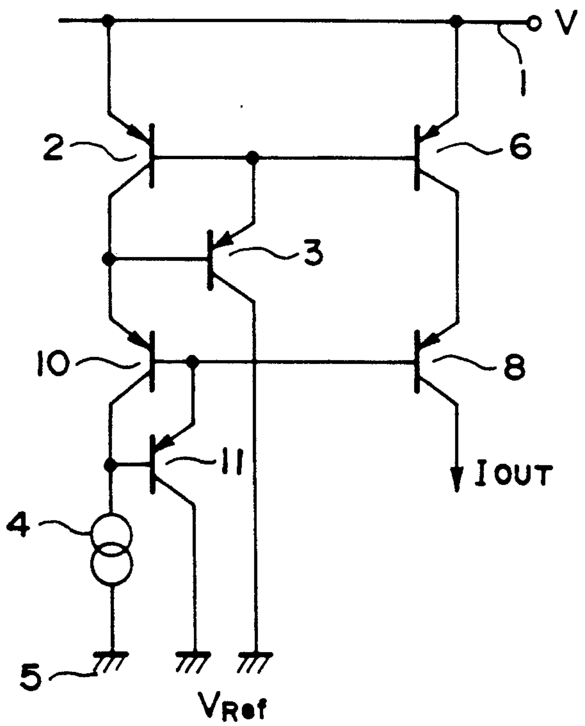
FIG. 6 is a circuit diagram of the second embodiment of the invention.

FIG. 6 shows a circuit of embodiment 2 according to the invention. The conventional current mirror circuits are cascade connected. In this case, there are two advantages, that the constant current bias $I_B$ is unnecessary and the transistor of the second conductivity type is unnecessary. In a manner similar to the embodiment of FIG. 3, the collector potentials of the transistors 2 and 6 constructing the current mirror circuit can be equalized and the Early effect can be reduced.

According to the invention as mentioned above, it is possible to obtain the current mirror circuit of a high precision which can remarkably reduce the error due to the base current and the error due to the Early effect.

What is claimed is:

1. A current mirror circuit comprising:

first and second transistors of a first conductivity type whose emitters are connected to a power source and whose bases are commonly connected;

a third transistor of the first conductivity type whose collector is connected to a reference potential and whose emitter is connected to the bases of said first and second transistors and whose base is connected to a collector of the first transistor;

a fourth transistor of the first conductivity type whose emitter is connected to a collector of the second transistor; and control means for controlling a base of said fourth transistor, wherein said control means comprises a fifth transistor of a second conductivity type and a constant current source, a base of said fifth transistor is connected to the collector of said first transistor, a collector of said fifth transistor is connected to said power source and an emitter of said fifth transistor is connected to the base of said fourth transistor, and said constant current source is provided between the emitter of said fifth transistor and said reference potential.

* * * * *